United States Patent
Ishida et al.

(10) Patent No.: US 8,116,092 B2
(45) Date of Patent: Feb. 14, 2012

(54) CIRCUIT BOARD AND METHOD OF MANUFACTURING SAME

(75) Inventors: Yuji Ishida, Kanagawa (JP); Hideto Takekawa, Kanagawa (JP); Masato Harikae, Kanagawa (JP); Kazutaka Terada, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 1028 days.

(21) Appl. No.: 12/035,819

(22) Filed: Feb. 22, 2008

(65) Prior Publication Data

US 2008/0212300 A1   Sep. 4, 2008

(30) Foreign Application Priority Data

Feb. 22, 2007  (JP) ................................. 2007-041755

(51) Int. Cl.
  *H05K 7/06*  (2006.01)
  *H05K 3/32*  (2006.01)
(52) U.S. Cl. .......................................... 361/767; 29/832
(58) Field of Classification Search .................. None
  See application file for complete search history.

(56) References Cited

U.S. PATENT DOCUMENTS

| | | | | |
|---|---|---|---|---|
| 4,254,445 A * | 3/1981 | Ho | ................ | 361/728 |
| 4,414,741 A * | 11/1983 | Holt | ................ | 29/837 |
| 5,877,033 A * | 3/1999 | Matern | ................ | 438/14 |
| 7,699,321 B2 * | 4/2010 | Weller et al. | ................ | 279/43.7 |
| 7,915,718 B2 * | 3/2011 | Lee et al. | ................ | 257/668 |
| 2003/0098178 A1 * | 5/2003 | Shibuya et al. | ................ | 174/261 |
| 2003/0164551 A1 * | 9/2003 | Lee et al. | ................ | 257/778 |
| 2004/0065473 A1 * | 4/2004 | Chang et al. | ................ | 174/261 |
| 2007/0103182 A1 * | 5/2007 | Nawata | ................ | 324/765 |
| 2008/0190651 A1 * | 8/2008 | Klamminger et al. | ........ | 174/250 |
| 2009/0000814 A1 * | 1/2009 | Primavera et al. | ............ | 174/266 |

FOREIGN PATENT DOCUMENTS

| | | |
|---|---|---|
| JP | 62-4165 | 1/1987 |
| JP | 07-086729 | 3/1995 |
| JP | 2003-168501 | 6/2003 |

* cited by examiner

*Primary Examiner* — Gregory Thompson
(74) *Attorney, Agent, or Firm* — Morrison & Foerster LLP (57) ABSTRACT

A circuit board includes a substrate, a conductive pattern arranged on the substrate that includes an interconnecting circuit. The circuit board also includes a plurality of land pads having a pair of first land pads on which no electronic components are mounted and electrically connected to each other through the interconnecting circuit. The circuit board further includes an insulating layer on the substrate. The insulating layer has first openings that allow the pair of the first land pads to be exposed through the insulating layer.

20 Claims, 6 Drawing Sheets

CIRCUIT BOARD AND METHOD OF MANUFACTURING SAME

CROSS REFERENCE TO RELATED APPLICATION

This application claims foreign priority based on Japanese Patent application No. 2007-041755 filed Feb. 22, 2007, the contents of which is incorporated herein by reference in its entirety.

BACKGROUND OF THE INVENTION

1. Field of the Invention

The present invention relates to circuit boards having pre-determined circuit patterns formed thereon, electronic apparatuses utilizing the circuit boards, and methods for manufacturing the circuit boards.

2. Description of the Related Art

Generally, a process of designing a circuit board includes a sequence of designing the circuit(s) to be formed on the circuit board, manufacturing the circuit board according to the determined design values, and then testing the manufactured circuit board. When a problem is found during testing, the design of the circuit(s) may be modified and, thereafter, the modified circuit board is manufactured and tested. This sequence of designing, manufacturing and testing is repeated until a circuit board meeting desired or required operational specifications is formed.

To make testing of circuit boards easier, circuits having low resistance elements (inspection points) formed thereon have been designed. At various stages of testing, repairing, development and/or production, pre-determined portions of the circuit can be intentionally short-circuited through the low resistance elements, or the low resistance elements can be removed to detect the current flowing through one or more components on the circuit board. Since the low resistance elements are not necessary for the final intended functionality of the circuit board, it is desirable that all of the low resistance elements are replaced by conductive patterns (interconnections) at the time of mass-production of circuit boards. However, since the utilization of the low resistance elements can make inspection of defective circuit boards simpler and easier, circuit boards having the low resistance elements mounted thereon are often mass-produced.

For example, Japanese Unexamined Patent Application Publication No. 07-86729 and Japanese Unexamined Utility Model Registration Application Publication No. 62-4165 disclose techniques for mounting an inspection point on a circuit board.

When low resistance elements are not formed on the circuit board, an inspection of the circuit board requires removing mounted electronic components one by one to confirm proper operation of each electronic component. In addition to being very time and labor intensive, another disadvantage of this approach is that the mounted electronic components may be broken at the time of removal. Japanese Unexamined Patent Application Publication No. 2003-168501 discloses a technique for overcoming such a disadvantage.

Mounting of low resistance elements on mass-produced circuit boards advantageously makes the inspection easier. However, the high costs for both resistance elements and for mounting them undesirably result in an increase in overall cost of a circuit board. In addition, since defects occur as result of mounting the low resistance elements at the same probability as that of mounting ordinary resistance elements, the production yield of circuit boards undesirably decreases in proportion to the number of the mounted resistance elements.

Thus, there is a need to provide circuit boards that more easily allow for inspections to be performed while lowering manufacturing and testing costs and improving production yields. Furthermore, there is a need for an improved method of manufacturing and testing such circuit boards.

BRIEF SUMMARY OF THE INVENTION

The invention addresses the above and other needs by disclosing a circuit board, and method of manufacture and testing the circuit board, that allows inspections to be performed more easily while lowering costs and improving production yields.

According to one embodiment of the invention, a circuit board includes a substrate, a conductive pattern arranged on the substrate, and a plurality of land pads connected to the conductive pattern. The conductive pattern includes an interconnecting circuit. The land pads include a pair of first land pads on which no electronic components are mounted.

In a further embodiment, the pair of the first land pads is electrically connected to each other through the interconnecting circuit. The circuit board also comprises an insulating layer on the substrate. The insulating layer has first openings that allow the pair of the first land pads to be exposed through the insulating layer.

According to another embodiment of the invention, an electronic apparatus includes a circuit board, an electronic component, and a housing containing the circuit board and the electronic component. The circuit board includes a substrate, a conductive pattern on the substrate including an interconnecting circuit. The circuit board also includes a plurality of land pads connected to the conductive pattern. The land pads comprises a pair of first land pads on which no electronic components are mounted and a pair of second land pads electrically connected to each other. The pair of the first land pads is electrically connected to each other through the interconnecting circuit. The circuit board further includes an insulating layer formed on a surface of the substrate. The insulating layer has at least one first opening that allows the pair of the first land pads to be exposed through the insulating layer. The electrical component is mounted on the pair of the second land pads and electrically connects the second land pads to each other.

According to a further embodiment of the invention, a method for manufacturing a circuit board includes preparing a substrate on which a circuit pattern, a pair of first land pads, and a plurality of second land pads connected to the circuit pattern, are formed. The circuit pattern includes an interconnecting circuit that electrically connects the first land pads to each other. The method also includes forming, on the surface of the substrate, an insulating layer having first and second openings that allow the first and second land pads to be exposed through the insulating layer, respectively. The method further includes mounting an electronic component on the second land pads.

DESCRIPTION OF THE PREFERRED EMBODIMENTS

Hereinafter, exemplary embodiments according to the present invention are described in detail below with reference to the appended figures. It should be understood that the figures are not necessarily drawn to scale and merely show exemplary features of the invention for the purpose of providing an enabling description of various embodiments of the invention. Therefore, the figures along with their associated text do not necessarily limit the scope of the invention as set forth by the claims provided herein.

Figure 1A:
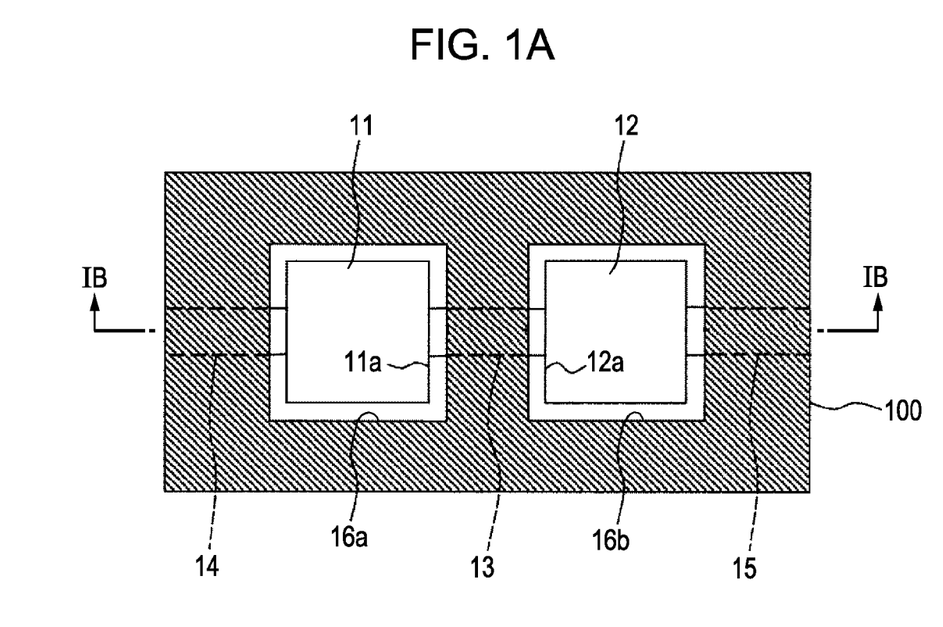
FIG. 1A is a partial top perspective view showing an example of a specific configuration of conductive land pads formed on a circuit board according to one embodiment of the present invention.
Figure 1B:
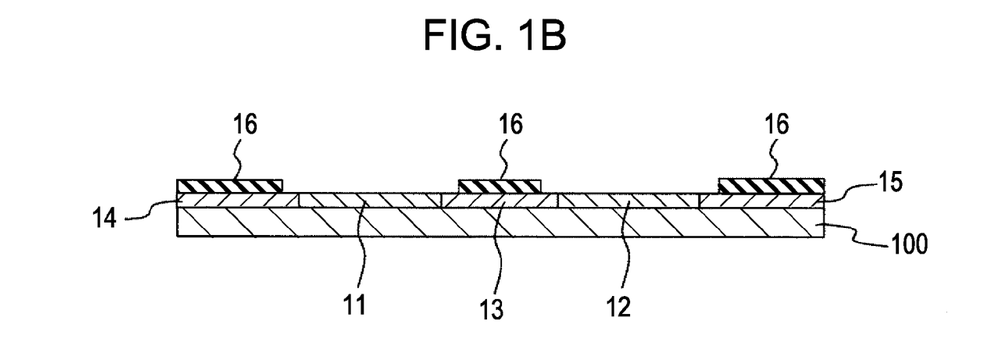
FIG. 1B is a sectional view taken from a line IB-IB' of FIG. 1A.

As shown in FIGS. 1A and 1B, a circuit board 100 includes conductive land pads 11 and 12, and a conductive pattern including an interconnecting circuit 13 and conductive circuits 14 and 15. The pair of conductive land pads 11 and 12, corresponding to first land pads, is formed side-by-side at a predetermined interval (e.g., 0.1 mm) on the circuit board 100 according to one embodiment of the invention. The interconnecting circuit 13 electrically interconnects the pair of conductive land pads 11 and 12. The conductive land pads 11 and 12 are also connected to conductive circuits 14 and 15, respectively. These conductive land pads 11 and 12, interconnecting circuit 13 and the conductive circuits 14 and 15 may be formed by any suitably conductive material, such as copper or gold.

The conductive land pads 11 and 12 are used as inspection points at the time of an inspection or testing of the circuit board 100 and as circuit traces or patterns (i.e., interconnections) at the time of operation of the circuit board 100. Accordingly, it is assumed that electronic components will not be mounted on the conductive land pads 11 and 12 of an actual product.

For example, as shown in FIG. 1A, the conductive land pads 11 and 12 are formed in a rectangular shape. The shape of the conductive land pads 11 and 12 is not limited to a rectangular shape and various kinds of shapes, such as polygonal, half-circular, half-oval, circular, or an oval shape, can be employed.

In one embodiment, the conductive land pads 11 and 12 are formed adjacently so that side 11a of the conductive land pad 11 faces side 12a of the conductive land pad 12. In other words, side 12a is opposite to side 11a. The interconnecting circuit 13 that interconnects the conductive land pads 11 and 12 is connected to the sides 11a and 12a at each end of the interconnecting circuit 13.

A resist layer 16, corresponding to an insulating layer 16, is formed on the circuit board 100. The resist layer 16 may include, for example, a photosensitive resin. However, any other suitable insulating material, such as silicon oxide and silicon nitride, for example, can be used as the insulating layer. The resist layer 16 has openings 16a and 16b, corresponding to a first pair of openings, at portions of the resist layer 16 facing the conductive land pads 11 and 12, respectively. The conductive land pads 11 and 12 are located inside the openings 16a and 16b, respectively. The openings 16a and 16b of the resist layer 16 expose the conductive land pads 11 and 12, respectively. Referring to FIGS. 1A and 1B, a shaded portion shows a portion of a surface of the circuit board having the resist layer 16 thereon.

Figure 2:
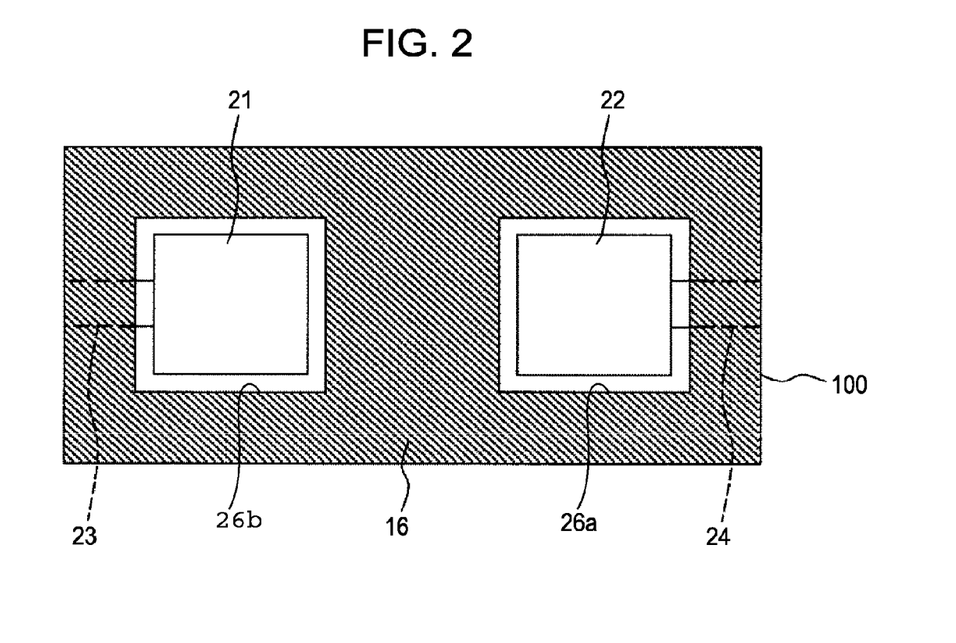
FIG. 2 is a partial top perspective view showing an example of a specific configuration of mounting land pads formed on a circuit board according to one embodiment of the present invention.

Referring to FIG. 2, in addition to the inspection points such as the conductive land pads 11 and 12, one pair of mounting land pads 21 and 22, corresponding to second land pads, are formed on the circuit board 100. The mounting land pads 21 and 22 allow an electronic component to be mounted thereon. The mounting land pads 21 and 22 may be positioned at any desired location on the circuit board 100 with respect to the conductive land pads 11 and 12 to achieve a desired circuit configuration, connectivity and layout.

As shown in FIG. 2, in one embodiment, the mounting land pads 21 and 22 are formed on the circuit board 100 at a predetermined distance from each other (e.g., 0.2 mm). The mounting land pads 21 and 22 may be provided in various shapes, such as, for example, rectangular, polygonal, half-circular, half-oval, circular, or an oval shape. Conductive circuits 23 and 24 included in the conductive pattern are connected to the mounting land pads 21 and 22, respectively. These mounting land pads 21 and 22 and the conductive circuits 23 and 24 may be formed from any suitable conductive materials such as copper and gold, for example.

The resist layer 16 is also formed on the circuit board 100 so as to expose the mounting land pads 21 and 22. In addition to the openings 16a and 16b, the resist layer 16 further has openings 26a and 26b, corresponding to second openings to provide access to the mounting land pads 21 and 22, respectively. Thus, the openings 26a and 26b expose the mounting land pads 21 and 22 through the resist 16, respectively.

As described above, in one embodiment, the interval (e.g., 0.1 mm) between the conductive land pads 11 and 12 is set smaller than the interval (e.g., 0.2 mm) between the mounting land pads 21 and 22 in the circuit board 100. Thus, the conductive land pads 11 and 12 can provide desired inspection points while utilizing a much smaller amount of space on the circuit board when compared to conventional low resistance elements, which are mounted to mounting pads on the circuit board.

As described above, since the circuit board 100 according to this embodiment comprises formation of the conductive land pads 11 and 12, which are electrically connected through the interconnecting circuit 13, it can reduce the number of low resistance elements required to be mounted on prior circuit boards, or can omit the use of low resistance elements altogether. Accordingly, it is possible to reduce the number of mounted components on a circuit board and to lower the manufacturing cost of the circuit board 100 when compared to conventional circuit boards having low resistance elements. Thus, it is possible to improve the overall yield of the circuit board 100 regarding defects of low resistance elements by reducing or omitting the step of mounting the low resistance elements onto a circuit board. Additionally, in one embodiment, since the interval between the conductive land pads 11 and 12 can be made to be smaller than the interval between the mounting land pad 21 and 22, a larger area of the circuit board can be used for mounting of electronic components, which allows the area of the circuit board to be utilized more efficiently.

Figure 3:
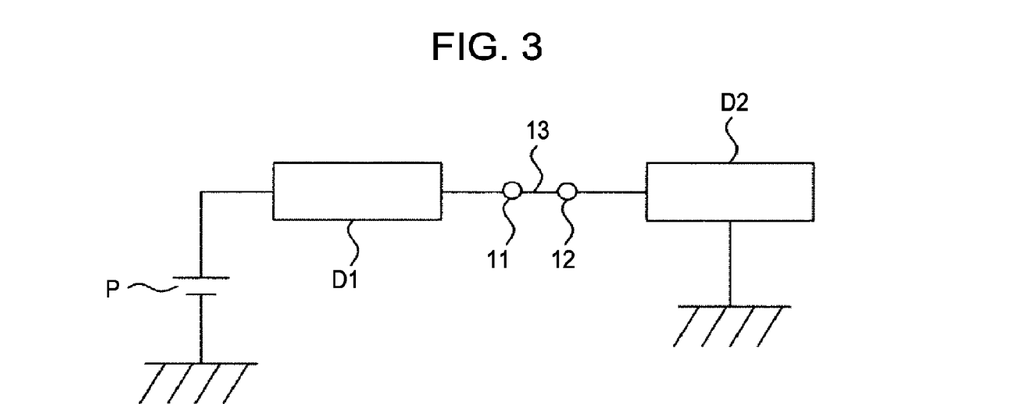
FIG. 3 is a diagram for illustrating a case where conductive land pads of a circuit board according to a first embodiment of the present invention are used as inspection points.

In accordance with one embodiment of the invention, the conductive land pads 11 and 12 can be used as inspection points. As shown in FIG. 3, devices D1 and D2 are serially connected to a power source P. The devices D1 and D2 are serially connected to the conductive land pads 11 and 12, respectively. Here, the device D1 is, for example, a voltage device for providing a predetermined voltage, while the device D2 is, for example, a memory. By cutting the interconnecting circuit 13 between the conductive land pads 11 and 12, the conductive land pads 11 and 12 can be used as inspection points. More specifically, for example, the current flowing only through the device D1 or the current flowing only through the device D2 can be measured, depending on where the power source is connected. Alternatively, an external power source may be connected to either D1 or D2 individually. Accordingly, the inspection can be performed more easily at the time of inspection of the circuit board 100 after manufacturing of the circuit board 100.

Figure 4:
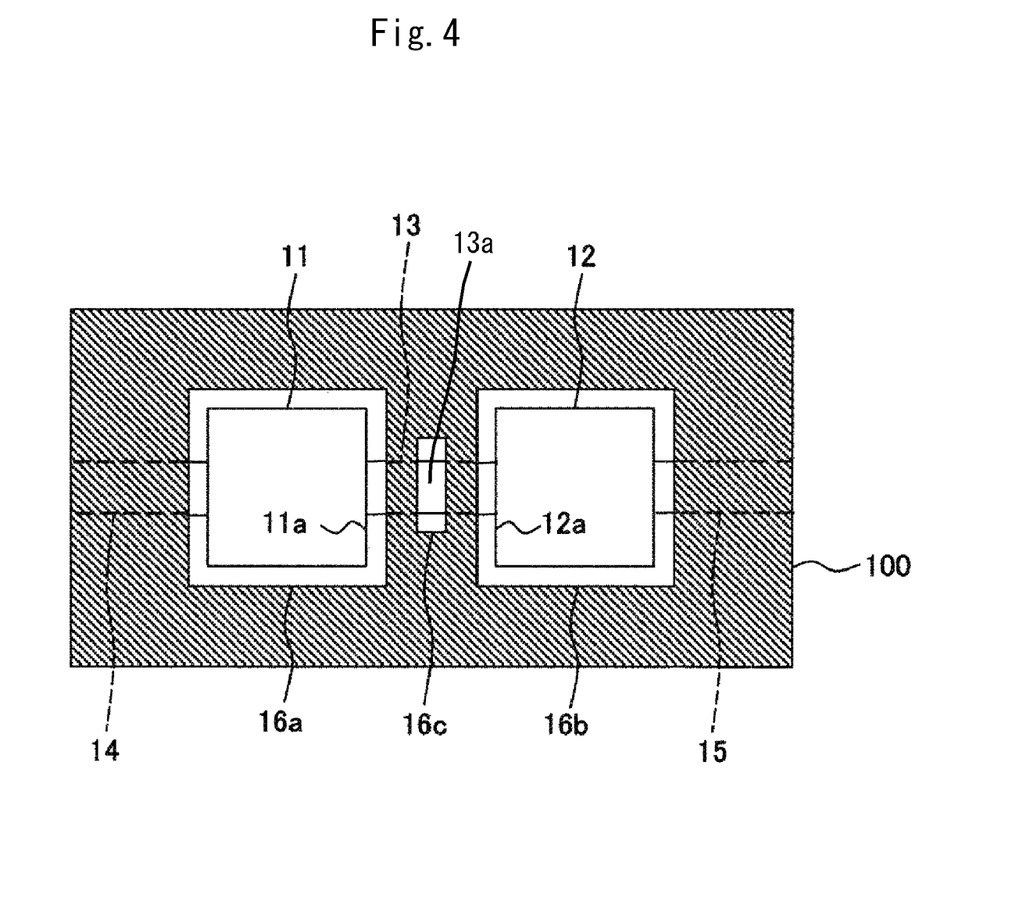
FIG. 4 is a diagram showing first openings and a third opening of a resist layer of a circuit board according to one embodiment of the present invention.

Additionally, as shown in FIG. 4, the circuit board 100 may have an opening 16c, corresponding to a third opening. The opening 16c is formed in the resist layer 16 covering the interconnecting circuit 13 between the conductive land pads 11 and 12. Since the opening 16c is located over the interconnecting circuit 13, the interconnecting circuit 13 is cut more easily when the conductive land pads 11 and 12 are used as the inspection points and cutting errors can be reduced. Additionally, since the opening 16c is provided at the cutting position 13a (over the interconnecting circuit 13), the position 13a to be cut can be easily found.

Figure 5:
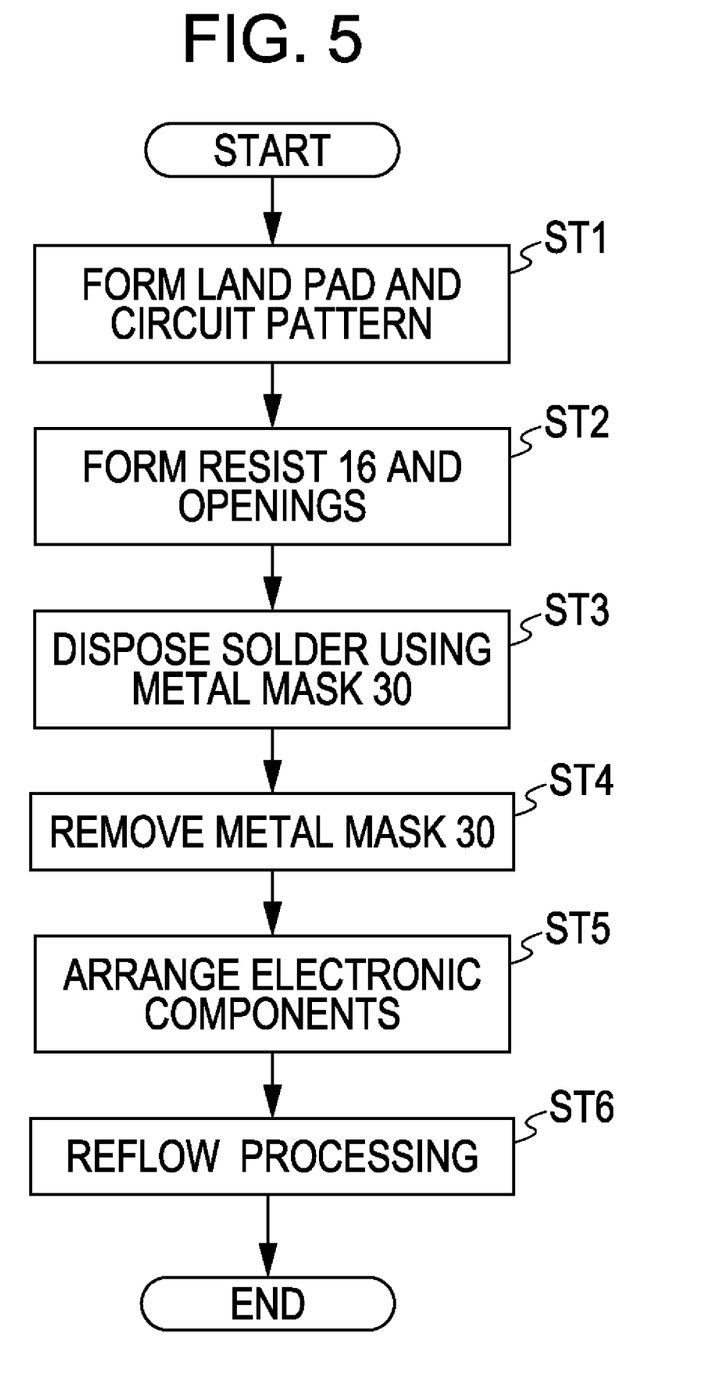
FIG. 5 is a flowchart showing an example of a method for manufacturing a circuit board according to one embodiment of the present invention.

FIG. 5 is a flowchart showing an exemplary method for manufacturing the circuit board 100, in accordance with one embodiment of the invention.

STEP ST1 (Land Forming Step):

A conductive layer is formed on a surface of the circuit board 100 and this conductive layer is patterned into predetermined shapes using photolithography or other well-known techniques, whereby circuit patterns including the conductive land pads 11 and 12, the interconnecting circuit 13, the conductive circuits 14 and 15, the mounting land pads 21 and 22, and the conductive circuits 23 and 24 are formed. In one embodiment, at least the land pads 11, 12, 21, and 22 and the circuit patterns 13, 14, 15, 23, and 24 are formed at the same time or during the same processing step. A conductive material, such as, for example, copper, gold, or ITO (Indium Tin Oxide), can be used as the conductive layer. In addition, various thin-film deposition techniques, such as electroplating, electroless-plating, sputtering, or and vapor deposition, can be used as the conductive-layer forming method.

STEP ST2 (Resist Forming Step):

Next, the resist layer 16 is formed on the surface of the circuit board 100. Using conventional photomasking or other well-known techniques, the openings 16a and 16b corresponding to the first openings, the openings 26a and 26b corresponding to the second openings, and the opening 16c corresponding to the third opening of the resist layer 16 are also formed at this step.

STEP ST3 (Solder Applying Step)

Figure 6A:
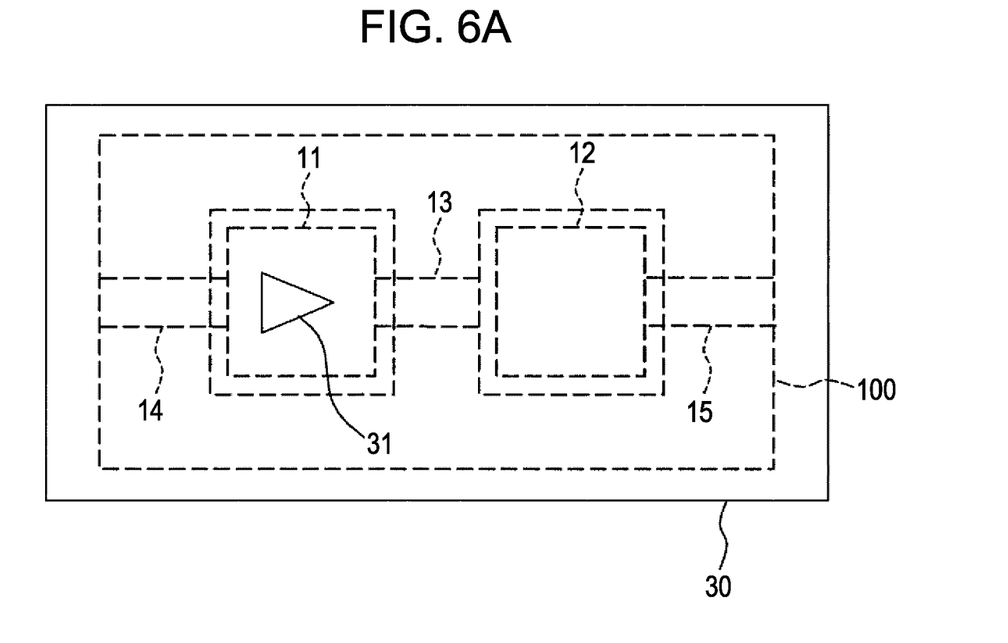
FIG. 6A is a partial top perspective view showing a positional relationship between a hole of a metal mask and conductive land pads according to one embodiment of the present invention.
Figure 6B:
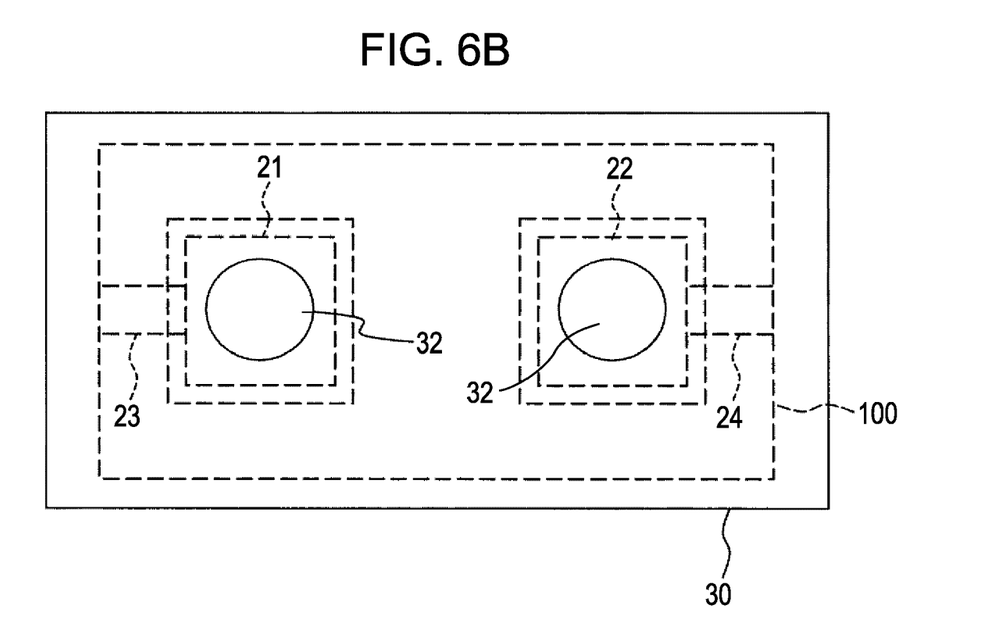
FIG. 6B is a top perspective view of a metal mask 30 that illustrates shapes of holes in the metal mask and the positional relationship between the holes in the metal mask and mounting land pads according to one embodiment of the present invention.

A conductive material, such as solder, is disposed (applied) at predetermined positions on the circuit board 100 using a metal mask 30. As shown in FIGS. 6A and 6B, the metal mask 30 is a metal plate having a first hole 31 corresponding to the first opening 16a, and also having second holes 32 corresponding to the second openings 26a and 26b. Note, in this embodiment, the metal mask 30 does not have a hole corresponding to the first opening 16b in the resist layer 16. First, the metal mask 30 is aligned on the circuit board 100 so that the first hole 31 and the second holes 32 are located over the conductive land pad 11 and the mounting land pads 21 and 22, respectively. Subsequently, solder cream, which is a conductive paste, is applied on the top surface of the metal mask 30 with the circuit board aligned and positioned under the metal mask 30. By sliding a squeegee along the upper surface of the metal mask 30, the holes of the metal mask 30 are filled with the solder cream. The metal mask 30 is then separated from the circuit board 100, whereby the solder cream remains at the predetermined positions of the circuit board 100 corresponding to the holes 31 and 32.

As shown in FIGS. 6A and 6B, the hole 31 of the metal mask 30 is arranged to overlap the conductive land pad 11 of the circuit board 100. The metal mask 30 allows solder to be disposed on the conductive land pad 11. One reason why the hole 31 of the metal mask 30 is arranged to overlap the conductive land pad 11 and why no hole is formed over the conductive land pad 12 is described below.

In addition, the shape of the hole 31 of the metal mask 30 differs from the shapes of the holes 32, corresponding to the second holes, of the metal mask 30. More specifically, as shown in FIGS. 6A and 6B, the hole 31 and the holes 32 have different shapes. In FIGS. 6A and 6B, the hole 31 is in a triangular shape, while the hole 32 are in a circular shape, for example.

Due to the different shapes of the holes 31 and 32 of the metal mask 30, a shape of solder disposed on the conductive land pad 11 of the circuit board 100 differs from that of solder disposed on the mounting land pads 21 and 22. Since this allows the conductive land pad 11 to be easily distinguished from the mounting land pads 21 and 22 when the metal mask 30 is removed (STEP ST4) and electronic components are arranged (STEP ST5) at the succeeding steps, a decrease in electronic-component arrangement mistakes is expected. The different solder shapes allow the position of the conductive land pad 11 to be easily found even after reflow soldering is performed at a succeeding step (STEP ST6). Thus, it is possible to reduce mistakes and the time typically required to find the conductive land pad 11 (and 12) serving as an inspection point from many land pads at the time of the inspection.

Although the hole 31 and the holes 32 have triangular and circular shapes, respectively, in FIGS. 6A and 6B, the present invention is not limited to these particular shapes and the holes 31 and 32 can have other shapes. Nevertheless, since it is desirable that the shapes of the solder disposed on the conductive land pad 11 and on the mounting land pads 21 and 22 differ from one another even after the reflowing, it is desirable that the shapes of the holes 31 and 32 differ from one another. More desirably, areas of the holes 31 and 32 differ from one another.

STEP ST4 (Metal-Mask Removing Step):

After the completion of disposing of solder (solder cream) at STEP ST3, the metal mask 30 is removed from the circuit board 100.

STEP ST5 (Electronic-Component Aligning Step):

At this step, electronic components to be mounted are arranged at mounting positions on the circuit board 100. Various electronic components can be arranged on the circuit board 100. For example, a resistance element may be arranged between the mounting land pads 21 and 22. In one embodiment, an automated mounting apparatus (e.g., a pick and place apparatus) may arrange and place the electronic components on the circuit board. The solder cream located at the mounting positions of the electronic components at STEP ST3 is flattened by the respective electronic components placed on each mounting pad.

STEP ST6 (Reflowing and Mounting Step):

After the completion of the arrangement of the electronic components at STEP ST5, reflowing is performed. As is known in the art, reflowing refers to the process of melting the solder and soldering the components onto the circuit board. Through the reflowing step, each electronic component arranged on the circuit board 100 is soldered onto the corresponding mounting land pad, whereby the electronic components are mounted on the circuit board 100. Some techniques for performing reflow include the use of infrared radiation and/or hot air as a means for melting the solder cream.

One reason why the hole 31 of the metal mask 30 is arranged to overlap the conductive land pad 11 and a hole is not formed over the conductive land pad 12 is to avoid the possibility that an electronic component may be mistakenly arranged between the conductive land pads 11 and 12. By placing solder over only the land pad 11, and not land pad 12, when an electronic component is mistakenly arranged between the conductive land pads 11 and 12, a Manhattan effect is caused, which permits the mistake to be easily viewed and discovered. The Manhattan effect refers to a phenomenon where an electronic component, which is supposed to be connected between two land pads, is soldered and fixed onto only one of the land pads and stands up due to the surface tension of the melted solder.

As described above, the solder is disposed on the conductive land pad 11, while the solder is not disposed on the conductive land pad 12 regarding the circuit board 100. Therefore, when an electronic component is mistakenly arranged between the conductive land pads 11 and 12, only one side of the electronic component is soldered and the electronic component stands up, due to the Manhattan effect. Accordingly, mistakenly disposed electronic components can be easily found after the reflowing step (STEP ST6). It should be understood that any suitable conductive bonding material that reflows at a desired temperature to allow for the Manhatten effect may be used in accordance with one embodiment of the invention.

Although solder is disposed on the conductive land pad 11 and is not disposed on the conductive land pad 12 in the above-described embodiment, the opposite configuration is also possible. Such a case also offers the same advantages as those of the above-described embodiment. In this case, a position of the hole 31 of the metal mask 30 is not over the conductive land pad 11 but over the conductive land pad 12.

In order to make the solder on the conductive land pad 11 (or 12) and the solder on the mounting land pads 21 and 22 different from one another in shape and/or area, making the opening 16a (or 16b) and the openings 26a and 26b different from one another in shape and/or area or making the land pads different from one another in shape and/or area may be used. The solder on the conductive land pad 11 (or 12) corresponds to a first conductive material and the solder on the mounting land pads 21 corresponds to a second conductive material.

Although solders are used as the first and second conductive materials in the above-described embodiment, a conductive adhesive can be used instead of the solder.

In addition, although the first and second conductive materials are applied onto the conductive land pad and the mounting land pads by mask printing in the above-described embodiment, the first and second conductive materials may be applied using a method other than mask printing.

Additionally, although different solder shapes allow the conductive land pads to be distinguished from the mounting land pads in the above-described embodiment, in alternative embodiments, the conductive land pads can be distinguished from the mounting land pads by markings. Laser marking or printing can be employed as the marking method.

Furthermore, the circuit board 100 according to the above-described embodiment may include two or more conductive land pads and two or more mounting land pads.

Figure 7A:
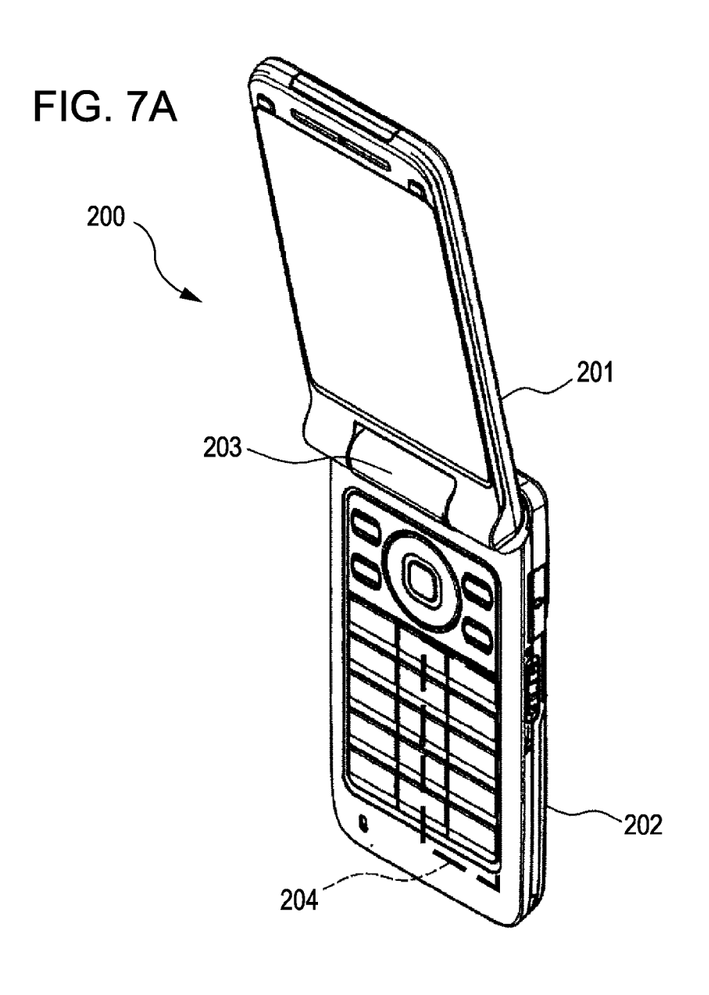
FIG. 7A is a perspective view showing a housing-opened mobile phone according to one embodiment of the present invention.
Figure 7B:
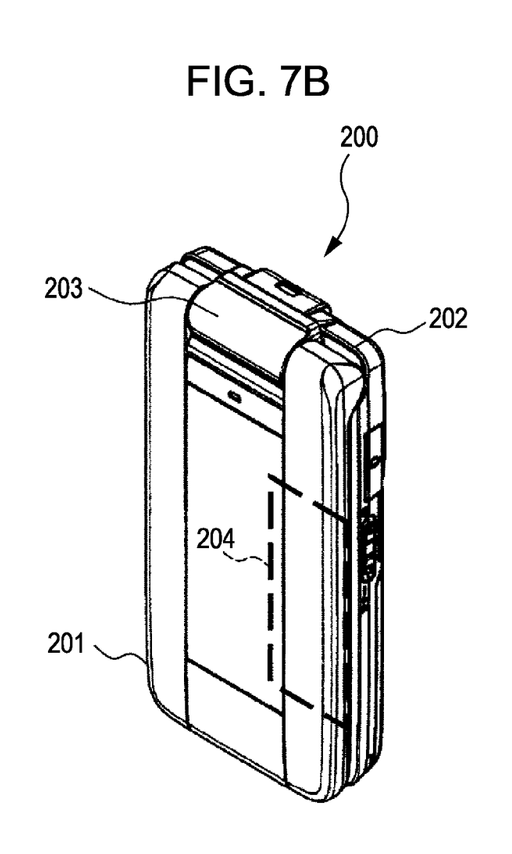
FIG. 7B is a perspective view showing a housing-closed mobile phone according to one embodiment of the present invention.

In a further embodiment, the circuit board 100 according to the above-described embodiment may be included in a mobile phone 200 shown in FIGS. 7A and 7B, for example. As shown in FIGS. 7A and 7B, an upper housing 201 and a lower housing 202 of the mobile phone 200 are openably and closably connected to each other by a hinge portion 203.

The upper housing 201 includes a display unit and a speaker. For example, an image display apparatus, such as an organic EL (Electro-Luminescence) device or an LCD (Liquid Crystal Display), can be used as the display unit.

The lower housing 202 has an operation unit including an off-hook key, an on-hook key, and a numeral keypad and a microphone for use in voice calls. The lower housing 202 also includes a circuit board 100 and a battery 204 (indicated by a broken line) for supplying the power to each component (i.e., electronic components on the circuit board 100) of the mobile phone 200.

The mobile phone 200 communicates with a base station, not shown, thereby being able to perform voice calls and data communication.

The electronic apparatus according to an embodiment of the present invention is not limited to the mobile phone 200 and may be any electronic apparatuses, such as, for example, a PDA (Personal Digital Assistant), a PHS (Personal Handyphone System), and a PC (Personal Computer), having electronic circuits and a circuit board therein.

While various embodiments of the present invention have been described above, it should be understood that they have been presented by way of example only, and not of limitation. Likewise, the above figures may depict exemplary configurations for the invention, which is done to aid in understanding the features and functionality that can be included in the invention. The invention is not restricted to the illustrated architectures or configurations, but can be implemented using a variety of alternative architectures and configurations. Additionally, although the invention is described above in terms of various exemplary embodiments and implementations, it should be understood that the various features and functionality described in one or more of the individual embodiments are not limited in their applicability to the particular embodiment with which they are described, but instead can be applied, alone or in some combination, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit board comprising:
   a substrate;
   a conductive pattern including an interconnecting circuit arranged on the substrate;
   a plurality of land pads comprising a pair of first land pads on which no electronic components are mounted, the pair of the first land pads being electrically connected to each other through the interconnecting circuit; and
   an insulating layer on the substrate, the insulating layer comprising at least one first opening that allows at least one of the pair of the first land pads to be exposed through the insulating layer, wherein the insulating layer covers at least part of the interconnecting circuit.

2. The circuit board according to claim 1, wherein the plurality of land pads further comprises a pair of second land pads to be connected to each other through an electronic component when the electronic component is mounted on the pair of the second land pads.

3. The circuit board according to claim 2, wherein the pair of first land pads are arranged side-by-side with respect to each other and a distance between the pair of first land pads is shorter than the distance between the pair of the second land pads.

4. The circuit board according to claim 2, further comprising: a first conductive material on at least one of the pair of the first land pads; and a second conductive material on the pair of the second land pads; wherein the first conductive material differs from the second conductive material in shape.

5. The circuit board according to claim 4, wherein the first and second conductive materials comprise solder.

6. The circuit board according to claim 2, wherein the insulating layer has at least one second opening that allows at least one of the pair of the second land pads to be exposed from the insulating layer, and wherein the first openings differ from the second openings in shape.

7. The circuit board according to claim 6, wherein the insulating layer comprises a third opening that allows the interconnecting circuit to be exposed from the insulating layer.

8. The circuit board according to claim 7, wherein the interconnecting circuit comprises a cut portion, and wherein the third opening is formed to expose the cut portion.

9. The circuit board according to claim 2, wherein the pair of the first land pads differs from the pair of the second land pads in shape.

10. The circuit board according to claim 1, wherein the insulating layer comprises a resist layer.

11. The circuit board according to claim 1, wherein the conductive pattern further comprises a conductive circuit, formed concurrently with the interconnecting circuit.

12. An electronic apparatus comprising: a circuit board including:
    a substrate;
    a conductive pattern including an interconnecting circuit arranged on the substrate;
    a plurality of land pads comprising a pair of first land pads on which no electronic components are mounted and a pair of second land pads electrically connected to each other, the pair of the first land pads being arranged side-by-side and being electrically connected to each other through the interconnecting circuit;
    an insulating layer on the substrate, the insulating layer having at least one first opening that allows at least one of the pair of the first land pads to be exposed through the insulating layer;
    an electronic component mounted on the pair of the second land pads, electrically connecting the second land pads to each other; and
    a housing containing the circuit board and the electronic component, wherein
    the insulating layer covers at least part of the interconnecting circuit.

13. A method for manufacturing a circuit board, comprising:
    receiving a substrate on which a conductive pattern, a pair of first land pads, and a pair of second land pads connected to the conductive pattern are formed, wherein the conductive pattern includes an interconnecting circuit that electrically connects the first land pads to each other;
    forming on the surface of the substrate an insulating layer having a plurality of openings that allow at least one of the pair of first land pads and the pair of second land pads to be exposed through the insulating layer; and
    mounting an electronic component on the pair of second land pads, wherein
    the insulating layer covers at least part of the interconnecting circuit.

14. The method according to claim 13, further comprising:
    preparing a mask having one or more first holes corresponding to a location of at least one of the first land pads and one or more second holes corresponding to a location of at least one of the second land pads, wherein the shape of the one or more first holes differs from the shape of the one or more second holes; and
    applying conductive paste onto the at least one of the first pads and the at least one of the second land pads through the one or more first holes and the or more second holes, respectively.

15. The method according to claim 13, wherein the conductive pattern further comprises a conductive circuit, wherein preparing the substrate includes forming the conductive circuit and the interconnecting circuit at the same step.

16. The method according to claim 13, wherein forming the insulating layer includes forming a layer that covers the pair of first land pads and the pair of second land pads, and thereafter forming the plurality of openings in the layer.

17. The method according to claim 16, further comprising forming a third opening in the insulating layer that allows the interconnecting circuit to be exposed through the insulating layer.

18. A method for manufacturing a circuit board, comprising
    forming on a substrate a conductive pattern, a pair of first land pads, and a pair of second land pads connected to the conductive pattern; and
    forming an insulating layer,
    wherein the conductive pattern includes an interconnecting circuit that electrically connects the pair of first land pads to each other and the pair of first land pads serve as inspection points upon which no components are mounted, and
    the insulating layer covers at least part of the interconnecting circuit.

19. A circuit board comprising:
    a substrate;
    a conductive pattern including an interconnecting circuit arranged on the substrate;
    a plurality of land pads comprising a pair of first land pads on which no electronic components are mounted, the pair of the first land pads being electrically connected to each other through the interconnecting circuit;
    an insulating layer on the substrate, the insulating layer comprising at least one first opening that allows at least one of the pair of the first land pads to be exposed through the insulating layer; and
    a conductive material applied on only one of the pair of the first land pads.

20. A circuit board comprising:
    a substrate;
    a conductive pattern including an interconnecting circuit arranged on the substrate;
    a plurality of land pads comprising a pair of first land pads on which no electronic components are mounted, the pair of the first land pads being electrically connected to each other through the interconnecting circuit;
    an insulating layer on the substrate, the insulating layer comprising at least one first opening that allows at least one of the pair of the first land pads to be exposed through the insulating layer; and
    a conductive material applied on only one of the pair of the first land pads, wherein the conductive material comprises solder.

* * * * *